United States Patent [19]

Buchanan

[11] Patent Number: 5,734,270
[45] Date of Patent: Mar. 31, 1998

[54] METHOD OF TESTING AN INTEGRATED CIRCUIT WITHIN AN AUTOMATED HANDLER ENVIRONMENT

[75] Inventor: James M. Buchanan, Austin, Tex.

[73] Assignee: Advanced Micro Devices, Inc., Sunnyvale, Calif.

[21] Appl. No.: 456,912

[22] Filed: Jun. 1, 1995

Related U.S. Application Data

[62] Division of Ser. No. 975,475, Nov. 12, 1992, Pat. No. 5,502,397.

[51] Int. Cl.⁶ .................................................. G01R 1/02
[52] U.S. Cl. ................................. 324/754; 324/755
[58] Field of Search ........................ 324/754, 755, 324/750, 731, 761, 762, 158.1; 439/68, 69, 70, 482

[56] References Cited

U.S. PATENT DOCUMENTS 5,109,596   5/1992   Driller et al. .................... 324/754

*Primary Examiner*—Vinh P. Nguyen
*Attorney, Agent, or Firm*—Michael J. Balconi-Lamica, Esq.; Jenkens & Gilchrist, P.C.; Paul S. Drake, Esq.

[57] ABSTRACT

A method for testing of an integrated circuit of a semiconductor device which is packaged in a housing with leads projecting from the housing and contact elements, other than leads, disposed along one or more of the surfaces of the housing is disclosed. A plurality of decoupling capacitors are mounted on a printed circuit board and disposed for being temporarily connected to the contact elements during testing of the integrated circuit at an automatic handler test station, wherein a test environment is created which closely approximates a real operating environment of the integrated circuit.

5 Claims, 3 Drawing Sheets

METHOD OF TESTING AN INTEGRATED CIRCUIT WITHIN AN AUTOMATED HANDLER ENVIRONMENT

This application is a division of Application Ser. No. 07/975,475, filed Nov. 12, 1992, now U.S. Pat. No. 5,502,397.

BACKGROUND OF THE INVENTION

1. Field of the Invention

The present invention relates generally to an improvement to the testing of integrated circuits ("ICs"), and more particularly, to an improved IC testing apparatus and method operating within an automated handler environment.

2. History of the Prior Art

Commercially-available ICs, i.e., semiconductor devices, are normally contained or packaged in a molded plastic housing having a generally rectangular, planar, box-like configuration. A typical IC package, commonly known as a "chip," includes one or more rows of evenly-spaced pins or leads extending perpendicularly from one face of the body and disposed along opposite and parallel sides of the body or, alternatively, along each side of the body. The semiconductor device may be a surface mounted device ("SMD") designed to be mounted directly on the surface of a circuit board or within a suitable receiving socket, or a dual-in-line packaged ("DIP") device intended for mounting with leads passing through the circuit board or within a suitable socket rather than for surface mounting.

Regardless of the nature of the semiconductor device or the specific manner of mounting, the reliability and functionality of the IC embodied in the device are important considerations for both manufacturers and users alike. A manufacturer, for example, may wish to inspect a production run or lot of semiconductor devices and discard those found to be defective. Additionally, the manufacturer would like to obtain a true and correct assessment of the capabilities of the device such as, for example, the maximum operating speed, which are directly related to the price the manufacturer can charge for the device. A customer, on the other hand, seeks an assurance that the device purchased from the manufacturer will perform according to manufacturer's specifications under real operating conditions.

A variety of manual and automatic apparatuses have been developed for testing the performance of a semiconductor device. In a manual testing apparatus, the operator manually places each device into a socket mounted on a test circuit board, conducts the test and then removes the device from the socket. By contrast, an automatic testing apparatus, commonly known as a "handler," includes a mechanism for automatically moving a plurality of devices, in sequence (one after the other) or in parallel (two or more together), into electrical contact with the testing board and for separating the defective devices from the fully functional devices in accordance with the test results.

The choice between a manual and an automatic testing apparatus has several implications. On the one hand, a manual testing apparatus using a socket mounted directly to the test circuit board offers an electromagnetic environment which approaches actual use. However, a manual test is both slow and time-consuming and requires frequent replacement of the sockets which tend to wear out rapidly. On the other hand, handlers have gained wide acceptance in the industry precisely because of their speed. Unfortunately, a handler tests the semiconductor device at a relatively remote location from the test circuit and/or the test measurement instrumentation and, therefore, in a suspect environment. To illustrate the importance of proximity of the semiconductor device to the test circuit, it is known, for example, that merely changing the lead length in a test situation by as little as a quarter inch from the actual use situation may lead to significant changes in the electrical response of the device under test.

In a typical handler, the device is momentarily brought to rest at a test station where a set of contacts are flexed or compressed by push bar action into electrical contact with the pins of the device. The contacts are usually a part of a probe or contactor assembly having an insulating base member on which the contacts are mounted. The contactor, therefore, establishes a signal path or link between the device and the testing apparatus. To determine whether a device is defective or functional, a series of test signals having a known response is generated by the testing apparatus and delivered by the contactor to the device. The response at some or all of the pins is then measured and compared to the expected response. If the results of the test do not match the predetermined responses, the device is considered to be defective or of an inferior performance grade, and may then be disposed of as appropriate. As explained below, however, this testing arrangement is plagued by a host of problems which undermine the integrity of the test itself.

One such problem arises from the inherent inductance of the contacts of the contactor. During a test, the test signal travelling through the contactor encounters an inductive reactance which is a function, in part, of the frequency of the test signal being applied. The test signal is usually "fast-rising," i.e. characterized by a very steep, step-like increase in voltage level of five (5) volts per nanosecond, for example. With the aid of Fourier analysis, such a test signal may be represented as a series of superimposed sine waves having frequencies which lie within a wide range or bandwidth, e.g. 0–300 MHz, and including very high frequency components. Since the inductive reactance of the contactor is proportional to the frequency of the test signal, a high test signal frequency implies a high inductive reactance. As is well known in the art, a high reactance produces distortions and reflections which degrade the quality and accuracy of the test. A description of various contactors directed to overcoming this problem may be seen in U.S. Pat. Nos. 4,689,556 and 4,747,784, both to Cedrone, which disclose improved characteristic impedance or generally frequency insensitive contactor assemblies for testing semiconductor devices with fast rising signals.

A related problem to inductive reactance is the presence of ground or power supply noise, i.e., changes in the reference voltage caused by current surges during the test procedure. It is well known in the field of microelectronics that high frequency operation, particularly the switching of integrated circuits, can result in transient energy being coupled into the power supply circuit of a device under test. To illustrate, a change in the state of a device, e.g., conducting to nonconducting, during a test may produce a transient current surge in the range of 20 milli-amperes per nanosecond. Such a surge may, in turn, cause the ground reference voltage of the device to change by one volt or more thereby distorting test measurements referenced to ground and leading to the false rejection of devices which are not defective and which would otherwise be considered acceptable or, alternatively, to the false acceptance of actually defective devices.

Heretofore, in the use but not the testing of semiconductor devices, the decoupling of undesired high frequency noise or interference from the power supply has been accomplished by connecting one or more decoupling capacitors between the power and ground leads of a semiconductor device. Various connection schemes have been devised for this purpose. According to one such scheme, a capacitor is mounted on a multilayer printed circuit board ("PCB") having plated-through holes which are used to connect the capacitor to the internal power and ground planes which are, in turn, connected to the power and ground leads of the semiconductor device. In another scheme, which suffers from the disadvantage of higher inductance, the decoupling capacitor interconnects to the power and ground leads of the semiconductor device via traces on either a multilayer or double-sided PCB. The advantages and disadvantages of the foregoing and other decoupling techniques are discussed in U.S. Pat. No. 4,734,819 to Hernandez et al. which generally discloses the use of a decoupling capacitor specifically sized and configured for mounting directly over a "leadless" surface mount semiconductor device, or under a "leaded" surface mount semiconductor device, and between the downwardly extending pins.

The use of decoupling capacitors in the testing of semiconductor devices has been far less effective than in actual operation where the decoupling capacitor may be positioned immediately adjacent to the semiconductor device on the PCB. Because of physical constraints in the testing environment, particularly the construction of the contactor, a decoupling capacitor could not be located sufficiently close to the semiconductor device undergoing testing to be equally effective in reducing noise. Specifically, it is known that a decoupling capacitor is not effective if located at a distance greater than a quarter inch from the device being tested. The configurations of prior art contactors have, however, precluded the location of decoupling capacitors within that critical distance. Furthermore, the construction of many prior contactors rendered the decoupling capacitors difficult to reach and sometimes completely inaccessible for repair or replacement. An attempt at overcoming some of these difficulties may be seen in U.S. Pat. No. 4,668,041 to La Komski et al. which discloses the use of pogo pins as contactors in a series of plates which together act as a decoupling capacitor.

Notwithstanding the improvements and solutions proposed in the prior art, the gap between the semiconductor device test environment and actual operating conditions continues to widen. While, as mentioned above, contactors have been developed with a view to minimizing the uncertainties introduced at the handler test station, the need for bridging the gap persists. Similarly, as the use of new and improved decoupling capacitors increases in actual operation, the need to duplicate their effectiveness during testing becomes more pronounced. While some have proposed the inclusion of decoupling capacitors inside a packaged semiconductor device, the scarcity of "real estate" or space, i.e., the packaging density, within the device and the diverging needs of customers militate against such a solution. In particular, even if the internal layout of the device permits the addition of decoupling capacitors to meet the requirements of a customer for whom high speed is the primary consideration, other, more cost-sensitive customers may not be willing or able to pay the higher price likely to be charged for such a package.

The present invention has been developed with the above and other engineering and economic considerations in mind. In general terms, the present invention provides a necessary tool designed to enhance the integrity and increase the accuracy of conventional IC testing apparatuses. More specifically, the present invention is particularly suited for the testing of semiconductor devices equipped with external contacts in addition to pins such as, for example, the decoupling "capacitor pads" described immediately below.

To facilitate the direct connection of decoupling capacitors to packaged semiconductor devices or chips for purposes of actual use, many manufacturers have recently begun to provide metallic capacitor pads across the top surface of the semiconductor device packages they manufacture. A typical capacitor pad consists of a pair of rectangular-shaped gold foils, one of which connects to the power plane and the other to the ground plane inside the semiconductor device package. A small surface mount capacitor, commonly known as a "chip capacitor," may be easily connected to the semiconductor device by, for example, soldering the capacitor to one of the capacitor pad pairs or by using conductive adhesives.

The availability of chip capacitor pads which can readily accommodate decoupling capacitors promotes a reduction in the length of the signal path and the value of the impedance which would otherwise be encountered were the signal or transient noise to travel from the semiconductor device through the PCB and to the decoupling capacitor as generally required in conventional or prior art decoupling arrangements. Manufacturers of semiconductor devices, however, are reluctant to indiscriminately impose on all their customers the additional costs associated with connecting decoupling capacitors to their chip capacitor pads. Such connection, therefore, is usually left to the individual customer who intends, for example, to use the semiconductor device in a system which has a low tolerance for noise or otherwise requires superior performance, and is not made, as a matter of course, at the factory.

Hence, while the customer may use a semiconductor device with decoupling capacitors directly connected to the capacitor pads, the manufacturer tests the same semiconductor device without the benefit of such decoupling capacitors and, thus, in a testing environment which is significantly different than the operating environment. As a previously mentioned, the physical constraints of a conventional handler environment, including a conventional contactor, prevent the placement of a decoupling capacitor within an effective distance from the semiconductor device being tested. Consequently, a mechanism is needed to temporarily connect decoupling capacitors to the chip capacitor pads during testing so as to closely replicate actual operating conditions and fairly evaluate the expected performance of the semiconductor device when used in a customer's circuit.

It is, therefore, an object of the present invention to provide an improved testing apparatus and method within a handler environment which includes a mechanism for converging the measurements taken at the test station with the responses observed in actual operation.

Another object of the present invention is to provide a controlled electromagnetic testing environment which closely simulates actual use conditions.

Yet another object of the present invention is to provide a testing apparatus and method which allow for the convenient connection and disconnection of electrical or electronic components to a semiconductor device under test.

A further object of the present invention is to provide a testing environment which may be readily adapted to the requirements of the test.

SUMMARY OF THE INVENTION

The present invention provides a method and an apparatus for the testing of an integrated circuit which is packaged in a housing having a plurality of leads and a plurality of contact elements. For purposes of the present invention, the term "leads," when used in connection with a packaged semiconductor device, includes generally cylindrical metallic pins, generally flat metallic leads and any other analogous or equivalent means for electrically connecting the integrated circuit inside the housing to circuits or components outside the housing. Similarly, the term "contact elements" includes generally flat metallic pads and any other analogous or equivalent means, other than the leads, for electrically connecting the integrated circuit inside the housing to circuits or components outside the housing.

In one aspect of the present invention, a method for the testing of an integrated circuit, which is packaged in a housing with a plurality of leads on one side of the housing and a plurality of contact elements on at least one other side of the housing, includes the steps of connecting the leads to a first test circuit and connecting the contact elements to a second test circuit. The first and second circuits may be mounted on first and second boards, respectively, in an automatic handler test station.

In another aspect of the present invention, an improved automatic handler test station which is used for the testing of an integrated circuit packaged in a housing with a plurality of leads projecting from the housing and a plurality of contact elements disposed along at least one surface of the housing, and which includes means for moving the leads into electrical contact with a contactor connected to a test circuit board, further includes means for temporarily connecting one or more electronic circuit components to the surface contact elements during the testing of the integrated circuit. The moving means may include, for example, a movable platform disposed adjacent to the housing of the integrated circuit. The connecting means may include, for example, a member disposed between the platform and the housing and adapted for mounting the electronic circuit components thereon. The connecting means may also include connectors electrically connected to the electronic circuit components and configured for conductive engagement with the surface contact elements when the leads are moved into electrical contact with the contactor during the testing of the integrated circuit at the handler test station.

In yet another aspect of the present invention, an improved method for testing an integrated circuit which is packaged in a housing with a plurality of leads projecting from the housing and a plurality of contact elements disposed along at least one surface of the housing, includes the steps of providing, in an automatic handler test station having a contactor connected to a test circuit board, a movable member to which one or more electronic circuit components may be connected; moving the leads into electrical contact with the contactor; and moving the member into electrical contact with the surface contact elements during the testing of the integrated circuit at the handler test station.

According to these and other aspects of the present invention, any of several desired values of an electrical or electronic variable, such as capacitance or power, may be provided for the integrated circuit being tested at the handler test station. The testing of the integrated circuit can thus be made to replicate the conditions of actual usage of the integrated circuit.

BRIEF DESCRIPTION OF THE DRAWINGS

The present invention will be better understood and its numerous objects and advantages will become apparent to those skilled in the art by reference to the following drawings in which like numerals or numbers designate like objects.

DETAILED DESCRIPTION

Figure 1:
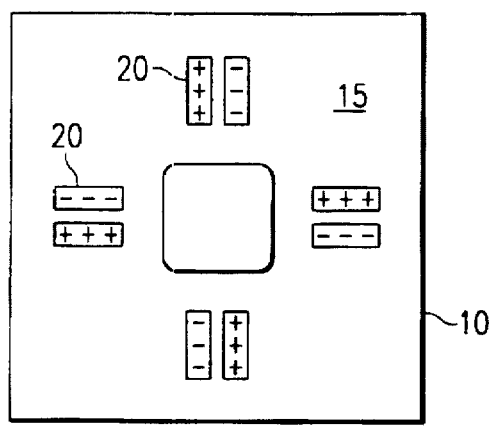
FIG. 1 is a top planar view of a conventional packaged semiconductor device having a plurality of surface mount capacitor pads.

Referring first to FIG. 1, a top planar view of a conventional packaged semiconductor device having a plurality of surface mount capacitor pads may now be seen. The construction of the semiconductor device 10 is well known to those of ordinary skill in the art and generally includes an integrated circuit (not shown) enclosed (packaged) within a dielectric housing 15 made, for example, of plastic or ceramic. A plurality of capacitor pads 20, each represented by a pair of rectangles marked with either a positive or a negative electrical sign (plus or minus), may be seen to form a cross-like pattern on the top surface of the housing 15. The plus-marked capacitor pads 20 are connected to the power plane, while the minus-marked capacitor pads 20 are connected to the ground plane, inside the housing 15. It should be clearly understood, however, that the size, shape or location of the capacitor pads 20 relative to the housing 15 are not material aspects of the present invention, and the specific arrangement actually shown on the top surface of the housing 15 in FIG. 1 is for illustration purposes only and is not intended as a limitation on the possible size, shape or location of the capacitor pads 20.

Figure 2:
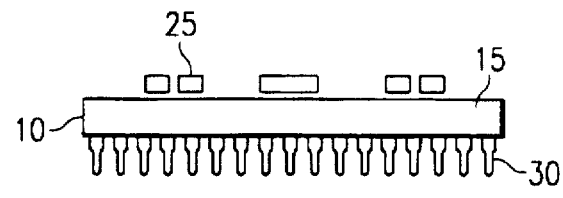
FIG. 2 is a side elevation view of the semiconductor device shown in FIG. 1 with decoupling capacitors connected to the capacitor pads for purposes of actual use.

Referring next to FIG. 2, a side elevation view of the semiconductor device 10 shown in FIG. 1 may now be seen. In FIG. 2, a plurality of decoupling capacitors 25 are connected to the capacitor pads 20 (not shown in FIG. 2) for purposes of actual use in a circuit constructed on a printed circuit board (PCB) (also not shown in FIG. 2). The reasons for the use of the decoupling capacitors 25 have heretofore been discussed in detail and reference is hereby made to the Background of the Invention section set forth above as may be necessary for a complete understanding of the function of the decoupling capacitors 25. As will be readily recognized by those of ordinary skill in the art, the semiconductor device 10 includes a plurality of pins configured, for example, as a conventional pin grid array (PGA) 30 which can be used to connect the semiconductor device 10 to the PCB.

Figure 3:
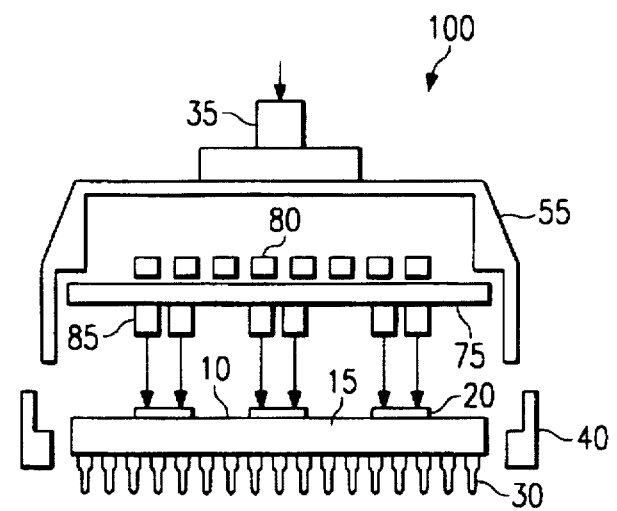
FIG. 3 is a cross-sectional elevation view of an illustrative handler test station constructed in accordance with the present invention and including a decoupling printed circuit board for use in testing the semiconductor device shown in FIG. 1.
Figure 3:
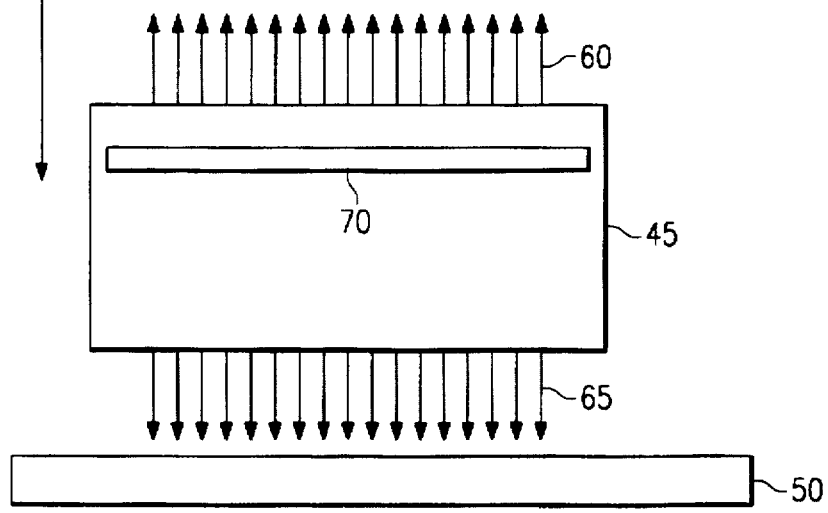

Referring now to FIG. 3, a cross-sectional elevation view of an illustrative handler test station constructed in accordance with the present invention may now be seen. It will be appreciated from the succeeding discussion that a variety of handlers may be used in implementing the concept of the present invention and, further, that the present invention may be adapted to a myriad of handler designs without compromising the teachings of the present invention. The illustrative handler test station 100 shown in FIG. 3 is part of an automatic handler which is sold under the brand name "Aetrium" and may be seen to include a plunger 35, a carrier 40, a contactor 45 and a test circuit board or motherboard 50. The plunger 35 of the Aetrium handler test station 100 has a cup-shaped lower end 55 which is generally referred to in the art as a "plunger cup." It should be noted that the lower ends of the plungers of other handlers may be flat-shaped or otherwise different from the plunger cup 55. However, in the prior art testing of a semiconductor device at the handler test station 100, the particular shape of the plunger cup 55 shown in FIG. 3 was found to provide the necessary "clearance" for any heat sinks residing on the top of the semiconductor device being tested.

While not all commercially available handlers include or require carriers, the Aetrium handler 100 uses the carrier 40 for the dual purposes of protecting the body and facilitating the movement of a certain semiconductor device to be tested, such as, for example, the semiconductor device 10 of FIGS. 1-2. The carrier 40 is fitted around the semiconductor device 10 at the entrance to the Aetrium handler and may be removed after the semiconductor device 10 has been tested at the test station 100. The contactor 45 may be any conventional contactor capable of establishing a connection between the semiconductor device 10 and the motherboard 50. Extending from the upper and lower sides of the contactor 45 in FIG. 3 are arrows 60, 65, respectively, which point in opposite directions. The upwardly pointing arrows 60 symbolize the contacts, e.g., spring-loaded pogo pins, which electrically link the contactor 45 with the semiconductor device 10 during testing at the handler station 100. The downwardly pointing arrows 65, on the other hand, symbolize any one of several conventional connection means between the contactor 45 and the motherboard 50.

At the start of a test session in which one or more semiconductor devices will be tested, i.e., during equipment set-up, the contactor 45 is connected to, or mated with, the motherboard 50. To perform a test on a particular semiconductor device, e.g., the semiconductor device 10 in FIG. 3, the semiconductor device 10, supported by the carrier 40, is momentarily brought to rest at the test station 100 and positioned between the plunger 35 and the contactor 45 such that the pogo pins 60 are in axial alignment with the pin grid array 30. The semiconductor device 10 is then pressed downward against the contactor 45 by the mechanical action of the plunger cup 55 which matingly engages the carrier 40 in a downward motion to the point of establishing electrical contact between the pin grid array 30 and the pogo pins 60. After a test signal has been applied to the semiconductor device 10 and the response measured, the mechanical force on the carrier 40 is released springing the pogo pins 60 back to their unbiased state and breaking the electrical connection between the semiconductor device 10 and the motherboard 50. The contactor 45 remains in continuous electrical contact with the motherboard 50 for the duration of the test session, i.e., until all other semiconductor devices have been similarly tested.

As described earlier, particularly in the Background of the Invention section hereof, testing a semiconductor device in the manner illustrated thus far suffers from certain shortcomings which have not heretofore been adequately addressed by the testing apparatuses of the prior art. To alleviate some of these concerns, the prior art has proposed, for example, the incorporation of a decoupling circuit 70 within the contactor 45. While such an addition marks an improvement over other contactor assemblies, its effectiveness in simulating actual operating conditions is limited by, for example, the distance between the decoupling circuit 70 and the semiconductor device 10 during testing. The present invention achieves, among others, the goal of creating a test environment which closely approximates the real operating environment by providing a more effective mechanism for selectively influencing the operation of the semiconductor device 10 under test conditions.

Referring again to FIG. 3, an illustrative embodiment of the improvement which is the subject of the present invention may now be seen. In FIG. 3, a printed circuit board (PCB) 75 is seen disposed within the plunger cup 55 and above the semiconductor device 10 to be tested. A plurality of decoupling capacitors 80 are mounted on the PCB 75 and electrically connected to a plurality of low profile pogo pins 85 extending perpendicularly downward through the PCB 75. The decoupling capacitors 80 may be surface-mount, radial lead or axial lead capacitors.

As described above, during the testing of the semiconductor device 10, the plunger 35 pushes downward against the carrier 40 which supports the semiconductor device 10. In accordance with the present invention, as the plunger cup 55 descends upon the carrier 40 during testing of the semiconductor device 10, the pogo pins 85 move into contact with the corresponding capacitor pads 20 and connect the decoupling capacitors 80 to the integrated circuit within the semiconductor device 10. In this manner, the decoupling capacitors 80 may simulate for the duration of the test the operation of, for example, the decoupling capacitors 25 which are connected to the semiconductor device 10 in actual use. Once the test is completed, the downward force on the plunger cup 55 is released and the pogo pins 85 move up and away from the capacitor pads 20 disconnecting the decoupling capacitors 80 from the semiconductor device 10.

As well known in the art, the PCB 75 may be manufactured from one or more layers (laminate) of an insulating (dielectric) substrate having the desired thermoelectric or material properties for a particular application. Typical laminate materials in wide use today include FR4, plastic and polyimide. Each laminate is coated with a conducting metal sheet, e.g., copper foil, either on one side only or on both sides (top and bottom sides). The copper foil, without more, may act as a power or ground plane, i.e., may be connected to a power supply or ground (or some reference voltage) when in use. Alternatively, the copper foil may be chemically treated to provide point-to-point electrical connections for a printed circuit or for separately manufactured component parts. For this purpose, a resist is deposited on the copper foil in a predetermined pattern and exposed to light, if the resist is a photoresist which is photosensitive, or otherwise exposed through silkscreen printing. The exposed copper surfaces are then etched in a chemical bath which leaves a conductive pattern on the surface of the laminate.

As will be readily appreciated by those of ordinary skill in the art, any one of a number of alternative embodiments of the PCB 75 may be used in the present invention depending on the needs of a particular application, the preferences of a particular user or the availability of constituent materials in stock at a particular moment in time. For example, the PCB 75 may be constructed from either a single layer or a plurality of layers of dielectric laminate.

Furthermore, each dielectric laminate may have a copper foil only on one side or on both sides. In addition, each copper foil may be finished into a conductive pattern as described above. For clarity and convenience, the term "basic laminate" shall be used hereinafter to designate an insulating laminate having a metal, e.g., copper, foil layer on both the upper and lower sides, the term "single-sided laminate" shall be used hereinafter to designate a basic laminate having an etched conducting pattern on one side (upper or lower side), and the term "double-sided laminate" shall be used hereinafter to designate a basic laminate having an etched conducting pattern on each of its upper and lower sides.

Figure 4:
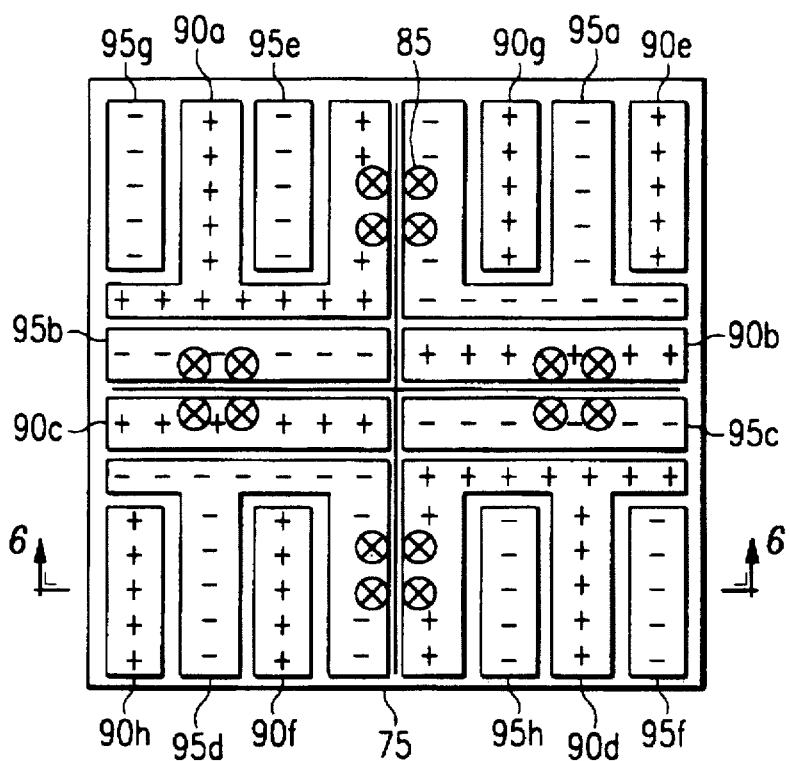
FIG. 4 is a top planar view of one embodiment of the decoupling printed circuit board shown in FIG. 3.
Figure 5:
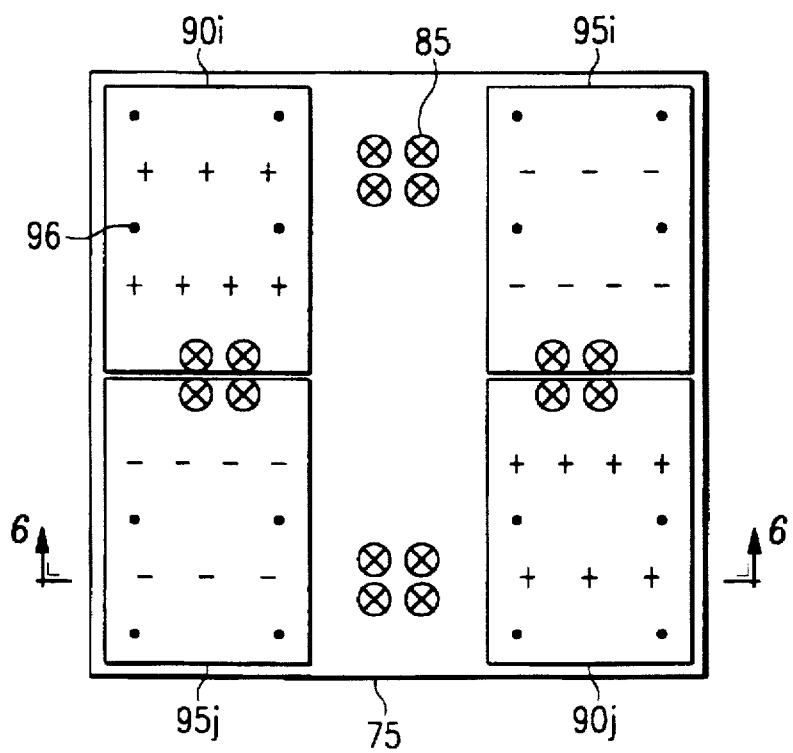
FIG. 5 is a bottom planar view of the decoupling printed circuit board shown in FIG. 4.
Figure 6:
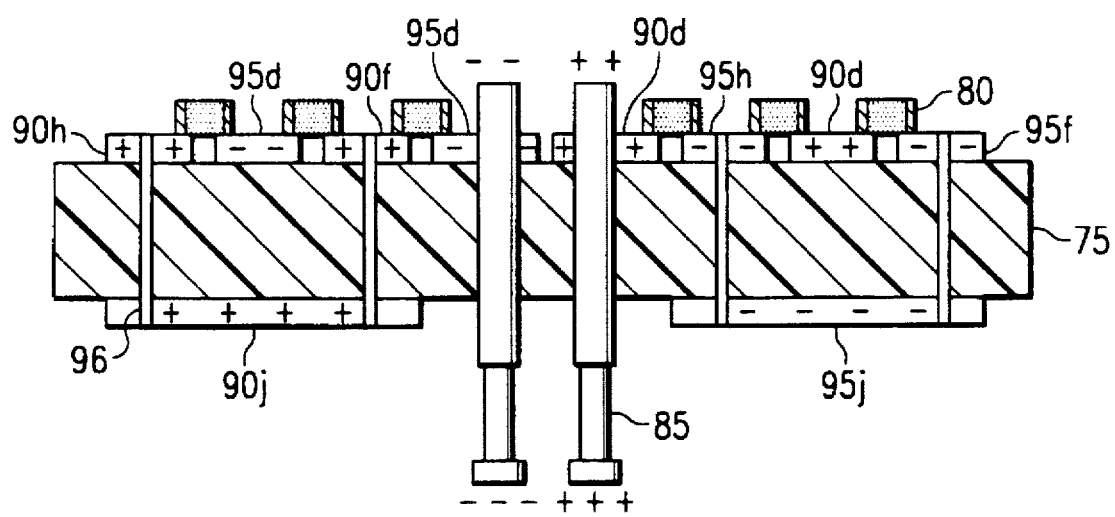
FIG. 6 is a cross-sectional view taken along line 6—6 through the decoupling printed circuit board shown in FIGS. 4–5.

Referring next to FIGS. 4-6, one embodiment of the PCB 75 may now be seen. FIG. 4 shows a top planar view while FIG. 5 shows a bottom planar view of the exemplary embodiment of the PCB 75. FIG. 6 shows a cross-sectional view taken along line 6—6 through the PCB 75 shown in FIGS. 4-5. For purposes of illustration, the PCB 75 in FIGS. 4-6 is shown to include only one double-sided laminate, i.e., one layer of insulating substrate having a conducting pattern on each of its upper and lower surfaces. Moreover, the conducting patterns on the single-layer PCB 75 shown in FIGS. 4-6 are exemplary only and represent but one of many possible layouts or decoupling schemes which may be used in accordance with the present invention.

With continuing reference to FIGS. 4-6, the upper surface (FIG. 4) and the lower surface (FIG. 5) of the PCB 75 include conductive regions of positive potential designated by a "+" (plus) sign and the alphanumeric characters 90a–j, and conductive regions of negative or ground potential designated by a "–" (minus) sign and the alphanumeric characters 95a–j. Each of the regions 90a–j and 95a–j is electrically connected, either directly or indirectly, to at least one of the pogo pins 85 which are positioned in holes drilled in the PCB 75 (FIG. 6). The pogo pins 85 extend perpendicularly downward through the plane of the PCB 75 with one end projecting from the upper surface and the other end projecting from the lower surface of the PCB 75. The holes for the pogo pins 85 may be plated-through (not shown) for mechanical strength and electrical conductivity.

The connection of the regions 90a–j and 95a–j to the pogo pins 85 may be made in any of several ways which are well known in the art. In the exemplary embodiment shown in FIGS. 4-6, each of the regions 90a–d and 95a–d on the upper surface of the PCB 75 (FIG. 4) is directly penetrated by a pair of pogo pins 85. The pairs of pogo pins 85 which penetrate regions 90b–c and 95b–c on the upper surface of the PCB 75 also penetrate regions 90i–j and 95i–j, respectively, on the lower surface of the PCB 75 (FIG. 5). Each of the pogo pins 85 is electrically connected to the corresponding region on the upper or lower surface of the PCB 75 by, for example, depositing a solder fillet (not shown) on the regional area immediately adjacent to the sides of the pogo pin. Connection of the remaining regions, 90e–h and 95e–h on the upper surface of the PCB 75 (FIG. 4), to the pogo pins 85 is made indirectly using through-hole "vias" (conductive connectors) 96 to the regions 90i–j and 95i–j on the lower surface of the PCB 75 (FIG. 5). The leftmost vias 96 in each of the regions 90i–j and 95i–j connect the pair of pogo pins 85 in that region to one of the regions 90e–f and 95e–f, respectively. Similarly, the rightmost vias 96 in each of the regions 90i–j and 95i–j connect the pair of pogo pins 85 in that region to one of the regions 90g–h and 95g–h, respectively.

Each of the decoupling capacitors 80 may be soldered to or otherwise connected between one of the positive regions 90a–j and one of the negative regions 95a–j in any conventional manner. FIG. 6 shows the connection of each of the decoupling capacitors 80 between one of the positive regions 90d, f, h and an adjacent one of the negative regions 95d, f, h on the upper surface of the PCB 75. During testing of the semiconductor device 10, the decoupling capacitors 80 will be connected to the semiconductor device when the pogo pins 85 come into contact with the chip capacitor pads 20.

In the embodiment shown in FIGS. 4-6, the pogo pins 85 are arranged in pairs in order to introduce redundancy in their alignment registration with the chip capacitor pads 20 so that at least one of the pogo pins 85 makes accurate and reliable contact with the corresponding one of the chip capacitor pads 20. Providing multiple connections to the capacitor pads 20 has the additional advantage of reducing electrical impedance and, hence, improving the performance of the decoupling circuit on the PCB 75. It will also be appreciated from the depiction in FIGS. 4-6 that many decoupling capacitors may be connected to the PCB 75 and prioritized such that capacitors with fast time constants are positioned close to the pogo pins 85 and those with slower time constants are positioned further away.

While the foregoing description shows a certain embodiment of the present invention, i.e., a single layer decoupling circuit board with pogo pins, those skilled in the art will recognize that many modifications and variations may be made without departing substantially from the spirit and scope of the present invention. By way of illustration only, and without limitation, the pogo pins 85 are not the exclusive means for connecting the PCB 75 to the chip capacitor pads 20 and, as will be recognized by those skilled in the art, many other connectors may be used. Similarly, the PCB 75 may include more than one layer of insulating substrate and each layer may have a patterned or unpatterned conducting layer (metal foil) only on one side or on both sides.

Figure 7:
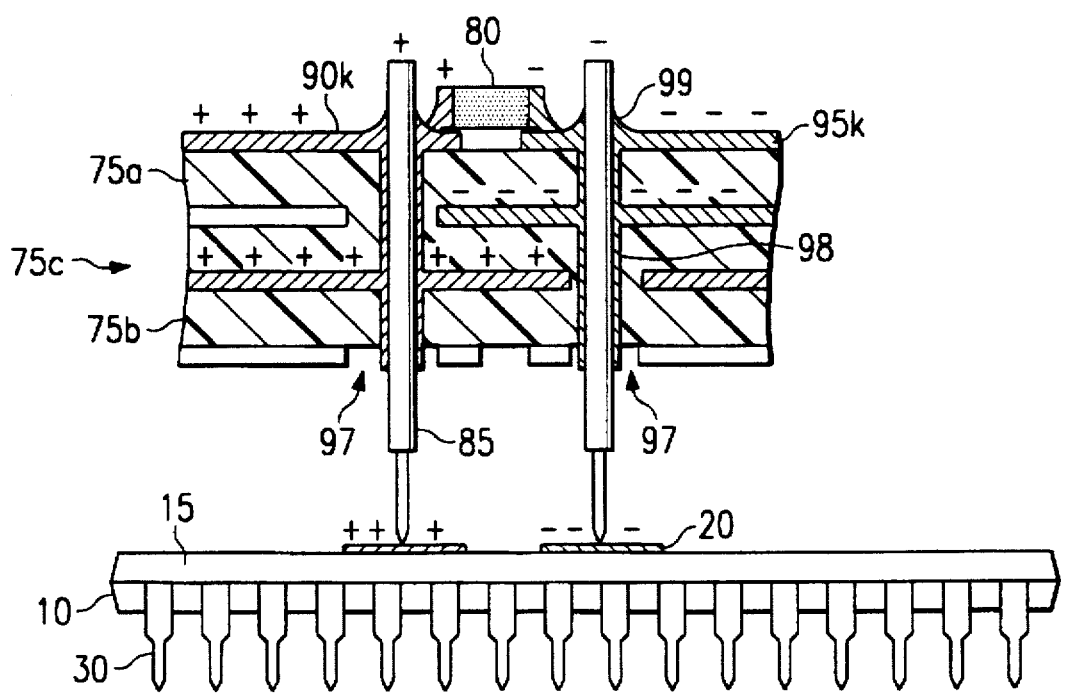
FIG. 7 is a partially enlarged fragmentary cross-sectional view of an alternative embodiment of the decoupling printed circuit board taken along a line similar to line 6—6 in FIGS. 4–5.

Referring next to FIG. 7, a partially enlarged fragmentary cross-sectional view of an alternative embodiment of the PCB 75 taken along a line similar to line 6—6 in FIGS. 4-5 may now be seen. In FIG. 7, the PCB 75 comprises two double-sided laminates 75a and 75b which are separated from each other by an insulating laminate 75c (with no copper cladding). The PCB 75c prevents the lower side of the PCB 75a from electrically contacting the upper side of the PCB 75b. The upper conducting layer of the PCB 75a has been patterned into a plurality of "+" and "–" regions only two of which, one "+" region 90k and one "–" region 95k, are shown in FIG. 7. An illustrative decoupling capacitor 80 is shown to be surface mounted between the regions 90k and 95k. The lower conducting layer of the PCB 75b is shown to be etched back at locations 97 to clear a path for two pogo pins 85 which have been installed in plated-through holes 98 in the PCB 75a–c. The upper ends of these two pogo pins 85 are electrically connected with solder fillets 99 to the regions 90k and 95k, respectively, on the upper conducting layer of the PCB 75a. During testing of the semiconductor device 10, the lower ends of these two pogo pins 85 will come into contact with the corresponding capacitor pads 20 on the semiconductor device 10 as shown in FIG. 7.

With continuing reference to FIG. 7, the lower conducting layer of the PCB 75a acts as the ground plane while the upper conducting layer of the PCB 75b acts as the power plane (the PCB 75c prevents any potential electrical interference between the ground plane and the power plane). The power plane and the ground plane may be used to supply a specified voltage to certain parts of the IC, or to connect other parts of the IC to ground, during testing of the semiconductor device 10. For this purpose, one or more holes, as needed, may be drilled in the PCB 75a–c for installing one or more pogo pins 85. These pogo pins 85 may be soldered to the power plane or ground plane, as appropriate, and can then deliver the specified voltage to the desired parts of the IC, or connect other parts of the IC to ground, through the capacitor pads 20.

It should be clear from the preceding description that the present invention offers a superior decoupling mechanism to those of prior art IC testing apparatuses. In those apparatuses, the signal path between the decoupling capacitors and the semiconductor device under test comprised a long loop passing through the contactor to the test circuit board and was surrounded by physical obstacles which compromised the integrity of the loop. According to the present invention, however, the decoupling capacitors are located above the semiconductor device where there are few or no physical obstacles and are connected directly to the integrated circuit inside the device. In other words, the present invention simulates, for the purpose of testing a semiconductor device, the action of decoupling capacitors which would be, for example, permanently soldered to the chip capacitor pads in actual operation, but which are only temporarily connected to the chip during testing in accordance with the present invention. Not only are the additional expenses of soldering decoupling capacitors to each chip saved, but also, the decoupling capacitors provided for by the present invention are reusable in the testing of thousands of chips and are readily accessible for repair or replacement.

The PCB 75 used in the present invention is relatively inexpensive, easy to build and capable of accommodating virtually every desirable decoupling scheme, i.e., customized for a particular decoupling application. In particular, there is an abundance of space or "real estate" on the PCB 75 for the connection of a large number of decoupling capacitors in any one of many possible arrangements. Furthermore, there is no need to "run wires" on or through the PCB 75 or to connect the PCB 75 to an independent power supply since the decoupling capacitors 80 will be energized by the power supplied from the tester through the contactor 45 to the semiconductor device 10 and passed from the capacitor pads 20 to the pogo pins 85 during testing of the semiconductor device 10. It should be recognized, however, that while the elimination of wires on or through the PCB 75 is a valuable feature for the decoupling application, numerous other applications of the present invention may require the use of wires to make the desired electrical connections.

Although the PCB 75 shown and discussed herein is used for decoupling purposes, many other uses are possible and are covered by the present invention. For example, in the testing of analog-to-digital (A/D) converters, it has been difficult to provide a low-noise reference voltage. With today's packaging technology, however, one may easily produce an A/D converter circuit in a package which includes "power pads" or "signal pads" resembling the chip capacitor pads illustrated herein. It is contemplated that, in accordance with the present invention, a power supply or other signal source may be connected to the PCB 75 and applied directly to the power or signal pads which are, in turn, connected to the appropriate components of the integrated circuit (IC) inside the A/D converter package.

Consistent with the above observations, it should be clear that other members besides the printed circuit board may be used in implementing the teachings of the present invention. Such other members include three-dimensional molded plastics, for example. In some applications, the plunger 35 may itself serve as the platform for connecting electrical or electronic devices or elements to the pad interface of the semiconductor device. It should also be clear that the pads may be located on the side rather than the face of the device without departing from the spirit of the present invention. The latter instance should be understood as a reference to the third dimension of the interface to the device and is included within the teachings of the present invention. Also included within the present invention are contact elements, other than what has been heretofore referred to as pads, which provide external access to the internal circuit of a packaged semiconductor device.

It will also be recognized that a fundamental difference between the present invention and prior art testing apparatuses lies in the approach to the semiconductor device interface. For purposes of testing a semiconductor device, the prior art has viewed the device as having a one-dimensional spatial interface, i. e, the pin grid array (PGA) projecting, for example, from the sides of a DIP device or the belly of an SMD. Consequently, for example, many prior art decoupling arrangements concentrated on the contactor which connects to the PGA and endeavored to solve the problem of minimizing the distance between the capacitors and the device by embedding the decoupling circuit 70 in the contactor 45. By contrast, the present invention views the semiconductor device as having at least a two-dimensional interface, e.g., the PGA as one dimension and the chip capacitor pads on the top surface of the device as another. As discussed herein, this novel approach to the testing of semiconductor devices offers many advantages, including the direct connection of decoupling capacitors to the integrated circuit (IC) inside the semiconductor device.

To summarize, described herein is a mechanism for providing a desired value or values of a variable, such as capacitance or power, to a semiconductor device being tested, for example, in a handler environment. Certain embodiments of this mechanism were discussed above. However, it should be clearly understood that the form of the invention described herein is exemplary only and is not intended as a limitation on the scope or coverage of the present invention.

What is claimed is:

1. In an automatic handler test station including a contactor connected to a test circuit board, an improved method for testing an integrated circuit of a semiconductor device which is packaged in a housing with a plurality of leads projecting from the housing and a plurality of contact elements, other than leads, disposed along at least one surface of the housing, the contact elements including positive (+) contact elements and negative (−) contact elements, said method comprising the steps of:

provgiding in the test station a movable member disposed above the semiconductor device, the movable member including a printed circuit board to which at least one electronic circuit component may be connected and configured for conductive engagement with the contact elements, the at least one electronic circuit component including a decoupling capacitor;

moving the leads into electrical contact with the contactor; and moving the movable member into electrical contact with the contact elements, wherein the decoupling capacitor of the printed circuit board of the movable member is temporarily connected directly to the integrated circuit of the semiconductor device between a corresponding positive (+) contact element and a negative (−) contact element such that the test station effectively replicates an actual usage condition of the integrated circuit of the semiconductor device.

2. The method of claim 1, wherein the printed circuit board of the movable member further includes low profile pogo pins extending perpendicularly downward through the printed circuit board, the pogo pins being electrically coupled to the decoupling capacitor and used for establishing the conductive engagement with the contact elements.

3. The method of claim 2 wherein the contact elements include capacitor pads on a top surface of the housing and the pogo pins are further arranged in pairs for providing a redundancy in an alignment registration with individual ones of the capacitor pads sot that a least one of the pogo pins of a corresponding pair of pogo pins makes an accurate and reliable contact with a corresponding one of the capacitor pads.

4. A method for the testing in a test station of an integrated circuit of a semiconductor device which is packaged in a housing with a plurality of leads on one side of the housing and a plurality of contact elements, other than leads, on at least one other side of the housing, said method comprising the steps of:

connecting the leads to a test circuit board; and connecting the contact elements to a printed circuit board, the printed circuit board having decoupling capacitors and conductive patterns thereon in accordance with a particular decoupling scheme, wherein each of the decoupling capacitors of the printed circuit board are temporarily connected directly to the integrated circuit of the semiconductor device between a positive (+) contact element and a negative (−) contact element of the contact elements such that the test station effectively replicates an actual usage condition of the integrated circuit of the semiconductor device.

5. The method of claim 4 wherein the test circuit board is stationary and printed circuit board is movable within the test station.

* * * * *

UNITED STATES PATENT AND TRADEMARK OFFICE
CERTIFICATE OF CORRECTION

PATENT NO.     : 5,734,270
DATED          : March 31, 1998
INVENTOR(S)    : James M. Buchanan It is certified that error appears in the above-identified patent and that said Letters Patent is hereby corrected as shown below:

Column 4,
Line 39, replace "As a" with -- As --

Column 13,
Line 14, replace "sot that a" with -- so that at --

Signed and Sealed this

Twenty-fifth Day of March, 2003

JAMES E. ROGAN
*Director of the United States Patent and Trademark Office*